(12) United States Patent
Nakabayashi et al.

(10) Patent No.: US 6,514,864 B2
(45) Date of Patent: Feb. 4, 2003

(54) FABRICATION METHOD FOR SEMICONDUCTOR INTEGRATED CIRCUIT DEVICE

(75) Inventors: Shinichi Nakabayashi, Hanno (JP); Hisahiko Abe, Mito (JP); Katsuhiro Ota, The Atria (SG)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/854,578

(22) Filed: May 15, 2001

(65) Prior Publication Data

US 2001/0044210 A1 Nov. 22, 2001

(30) Foreign Application Priority Data

May 17, 2000 (JP) ........................................ 2000-145379

(51) Int. Cl.⁷ ..................... H01L 21/302; H01L 21/311
(52) U.S. Cl. ..................... 438/692; 438/691; 438/693; 438/694
(58) Field of Search ................................. 438/691–696

(56) References Cited

U.S. PATENT DOCUMENTS

| | | | | |
|---|---|---|---|---|
| 5,769,689 A | * | 6/1998 | Cossaboon et al. | 106/3 |
| 5,904,159 A | * | 5/1999 | Kato et al. | 134/1.3 |
| 5,916,855 A | * | 6/1999 | Avanzino et al. | 51/307 |
| 5,934,978 A | * | 8/1999 | Burke et al. | 106/3 |
| 6,114,249 A | * | 9/2000 | Canaperi et al. | 438/691 |
| 6,120,571 A | * | 9/2000 | Aihara et al. | 106/3 |

FOREIGN PATENT DOCUMENTS

| | | |
|---|---|---|
| JP | 8257898 | 10/1996 |
| JP | 10193255 | 7/1998 |
| JP | 11246852 | 9/1999 |

OTHER PUBLICATIONS

Science of CPM, published Jul. 19, 1999; Science Forum Co., Ltd.; pp. 128–142.

* cited by examiner

Primary Examiner—Michael S. Lebentritt
(74) Attorney, Agent, or Firm—Antonelli, Terry, Stout & Kraus, LLP

(57) ABSTRACT

For carrying out chemical mechanical polishing while supplying a polishing slurry to a surface to be processed of individual wafers running through a mass-production process so as to suppress occurrence of microscratches by reducing the density of coagulated particles in the polishing slurry used in a chemical mechanical polishing step, the polishing slurry used is allowed to stand in a condition filled in a container for at least 30 days or over, preferably 40 days or over, and more preferably 50 days or over so that the concentration of coagulated particles having a size of 1 $\mu$m or over is at 200,000 particles/0.5 cc, preferably 50,000 particles/0.5 cc, and more preferably 20,000 particles/0.5 cc.

24 Claims, 15 Drawing Sheets

DEPENDENCE OF SCRATCHES ON PARTICLE SIZE IN SLURRY $y = 0.0003 x^{1.2708}$

BEHAVIOR OF PARTICLES IN
THE COURSE OF STANDING

DEPENDENCE OF SCRATCH DENSITY ON STANDING TIME OF SLURRY

FABRICATION METHOD FOR SEMICONDUCTOR INTEGRATED CIRCUIT DEVICE

BACKGROUND OF THE INVENTION

This invention relates to a technique for fabricating a semiconductor integrated circuit device; and, more particularly, the invention relates to a technique that is applicable to the fabrication of a semiconductor integrated circuit device, including the step of polishing a thin film formed on the surface of a semiconductor wafer by a chemical mechanical polishing (CMP) method.

In the fabrication of a semiconductor integrated circuit device, an insulating film or dielectric film deposited on a silicon wafer is polished by a chemical mechanical polishing method to form an element isolation groove, to planarize an interlayer insulating film or to form a plug or a buried wiring.

In the conventional chemical mechanical polishing method, a polishing slurry is supplied on a lapping plate to which a pad made of a hard resin is attached, and the surface of a wafer is polished. As a polishing slurry, there is usually employed a slurry wherein fine particles of an abrasive, such as silica (silicon oxide), are dispersed in pure water, to which slurry an alkali for pH adjustment is added.

For silica in the polishing slurry, there is used a colloidal silica obtained by using sodium silicate as a starting material, or fumed silica obtained by combusting silicon tetrachloride ($SiCL_4$) with an oxyhydrogen flame. The polishing slurry using the former colloidal silica has the problem that it contains sodium (Na) as an impurity. Although a colloidal silica is available whose content of sodium is reduced for overcoming the problem, such colloidal silica is inconveniently higher in production cost than the latter-mentioned fumed silica.

On the other hand, fumed silica is poorer than colloidal silica with respect to the dispersion stability in an aqueous dispersing medium. Accordingly, a problem has been indicated in the use of fumed silica in that, when a wafer is polished using a polishing slurry comprising this type of silica, the wafer surface suffers microscratches caused by coarse coagulations of the silica particles in the slurry. Many techniques for improving the dispersion stability of this type of slurry have been proposed.

It will be noted that the processes for preparing colloidal silica and fumed silica and the physical properties thereof are set out, for example, in Science of CPM, published on Jul. 19, 1999, by Science Forum Co., Ltd., pp. 128 to 142.

Japanese Laid-open Patent Application No. Hei 8(1996)-257 8 98 discloses an aqueous free grain slurry and its preparation. More particularly, abrasive particles, such as diamond, silicon carbide, alumina, silica, zirconia, cerium oxide, iron oxide, chromium oxide or the like, are applied on the surface thereof with plus charges from charge-determining ions, to which a surface active agent is attached so as to render the abrasive particles hydrophobic, thereby establishing a coagulated state. Eventually, the abrasive particles are prevented from settling with time, so that good dispersion stability and re-dispersability can be maintained over a long period of time.

Japanese Laid-open Patent Application No. Hei 11(1999)-246852 discloses a slurry for polishing and its preparation wherein the dispersability of abrasive grains is good. This slurry for polishing is made of a mixture of abrasive grains, an etching aqueous solution made of an alkaline or acidic aqueous solution having the ability of chemically etching a material to be polished, and a polymer material having a hydrophilic group, characterized in that the polymer material having a hydrophilic group is dispersed in the form of fine globules or is dissolved in the etching aqueous solution.

The abrasive grains used include those of oxides, sulfates or carbonates of silicon, aluminum, titanium, manganese, cesium, an alkaline earth metal or an alkali metal. The polymer material having a hydrophilic group includes a polyamide, a polyimide, a polyethylene, a polystyrene, a polyether, a polyurethane, a polycarbonate, a polyvinyl alcohol, a polyvinyl chloride or a polyvinylidene chloride, each having a carboxyl group, a hydroxyl group, a nitro group or an amino group.

With the slurry for polishing, the polymer material having a hydrophilic group is adsorbed on the abrasive grains, thereby imparting to the slurry thixotropic properties and the sedimentation-preventing function of the abrasive particles, under which the abrasive grains are mutually kept in a weakly coagulated state. Individual abrasive grains are kept in a well dispersed condition with the aid of the network structure through uniform secondary bonds of the molecules of the polymer material. As a result, the abrasive grains do not settle upon storage of the slurry; and, thus, the slurry can be used for polishing as it is without resorting to a procedure for recovering the dispersability by agitating the slurry again after long-term storage thereof.

Japanese Laid-open Patent Application No. Hei 10(1998)-193255 proposes a method of storing a slurry for polishing, which contains abrasive grains, such as of cesium oxide, alumina or manganese oxide, that are poor in dispersability in a liquid, so that when allowed to stand, they are coagulated with time and the polishing characteristics, such as the polishing rate or selection ratio of polishing, are changed in relation to time. In this storage method, after application of ultrasonic vibrations to the polishing slurry, the average size of the grains or a redox potential is measured so that the polishing rate is controlled by monitoring the average grain size or redox potential. It is stated that according to this method, because the degree of secular change in polishing rate of the polishing slurry can be confirmed, the polishing rate of the slurry under storage can be readily and reliably controlled, thus resulting in a great throughput and precise polishing.

SUMMARY OF THE INVENTION

In order to promote the scale down of elements and the formation of multi-layered wirings, a recent LSI is subjected to chemical mechanical polishing in a plurality of steps of a wafer process. For instance, in the step of forming an element isolation groove in the main surface of a wafer, the main surface of the wafer is dry etched using an oxidation-resistant film as a mask to form a groove in an element isolation region. Subsequently, a silicon oxide film is deposited on the main surface of the wafer, including the inside of the groove, to a thickness larger than the depth of the groove, followed by subjecting the silicon oxide film to chemical mechanical polishing by use of the oxidation-resistant insulating film as a stopper for polishing, thereby selectively leaving the silicon oxide film inside the groove to form an element isolation groove.

In such a chemical mechanical polishing step as set out above, it is usual to use a polishing slurry wherein silica particles are dispersed in water. Silica has a hydrophilic silanol group (Si—OH) on the surface thereof, so that when silica particles are dispersed in water, coagulation of particles (primary particles) takes place owing to the hydrogen bond among particles through the silanol group and the van der Waals force, thereby forming coagulated particles (secondary particles) having a size (i.e. diameter) larger than a single particle. Accordingly, the coagulated particles constitute a grain component in a polishing slurry where silica particles (dispersoid) are dispersed in water (dispersion medium).

When the coagulated particles are relatively small in size, little or no problem is involved. Nevertheless, an actual polishing slurry has coarse coagulated particles having a size of 1 pm or over (in this specification, coagulated particles having a size of 1 pm or over is especially called "coarse coagulated particles Such coarse coagulated particles cause fine defects, which are called micrO3cratche3, to occur on the surface of a wafer, thereby bringing about the lowerings of yield and reliability. For instance, in the step of forming such an element isolation groove as set out before, the silicon oxide film is subjected to chemical mechanical polishing by use of the oxidation-resistant insulating film as a stopper for the polishing. When microscratches are caused in the surface of the oxidation-reSi3tant insulating film, part of the microscratches reaches the underlying silicon substrate, thereby damaging the surface thereof.

For removing coarse coagulated particles from a slurry, a method of filtering the slurry is effective to an extent. Nonetheless, when the polishing slurry, from which the coagulated particles have been removed, is allowed to stand, coagulation takes place again, and thus, such a filtering method cannot be used as a fundamental measure.

In order to improve the dispersability of silica particles, it is effective to add a surface active agent to a polishing slurry. However, the use of a surface active agent needs an apparatus capable of coping with regulations on BOD and COD, and a measure against contamination with metallic ions in the surface active agent is also necessary. On the other hand, a method of agitating a polishing slurry prior to use has the possibility that foreign matter and coarse particles which have settled at the bottom of a slurry are undesirably included, and thus, this approach cannot be an effective measure against microscratches.

An object of the invention is to provide a technique for reducing the density of coagulated particles in a polishing slurry used in a chemical mechanical polishing procedure.

Another object of the invention is to provide a planarizing technique wherein microscratches can be reduced in number.

A further object of the invention is to provide a planarizing technique wherein a highly reliable integrated circuit can be formed.

A still further object of the invention is to provide a planarizing technique wherein the mass-production yield can be improved in a planarizing step in the production of a ULSI.

Another object of the invention is to provide a technique for control of a polishing slurry for planarization which is suited for mass-producing an integrated circuit device having a micro pattern.

The above and other objects and novel features of the invention will become apparent from the description provided in this specification when taken with reference to the accompanying drawings.

Typical embodiments of the invention are briefly summarized below.

(1) A method of fabricating a semiconductor integrated circuit device comprises the steps of:
  (a) allowing a polishing slurry used for chemical mechanical polishing to stand so that a concentration of coagulated particles having a size of 1 $\mu$m or over in the polishing slurry is at 200,000 particles/0.5 cc or below; and
  (b) subjecting a surface to be processed of individual wafers running through a mass-production process to chemical mechanical polishing while supplying the polishing slurry obtained after the step (a) to the surface.

(2) A method of fabricating a semiconductor integrated circuit device comprises the steps of:
  (a) allowing a polishing slurry used for chemical mechanical polishing to stand for 30 days or over; and
  (b) subjecting a surface to be processed of individual wafers running through a mass-production process to chemical mechanical polishing while supplying the polishing slurry obtained after the step (a) to the surface.

(3) A method of fabricating a semiconductor integrated circuit device comprises the steps of:
  (a) forming a groove in an element isolation region on a main surface of a wafer by etching the element isolation region on the main surface of the wafer by use, as a mask, of an oxidation-resistant insulating film formed on the main surface of the water;
  (b) forming a silicon oxide insulating film on the main surface of the wafer including the inside of the groove; and
  (c) subjecting the silicon oxide insulating film to chemical mechanical polishing through the oxidation-resistant insulating film as a stopper for polishing, so that the silicon oxide insulating film is selectively left inside the groove, thereby forming a polished, planarized insulating film isolation groove in the element isolation region on the main surface of the wafer, wherein, when the silicon oxide insulating film is subjected to chemical mechanical polishing, a polishing slurry obtained after being allowed to stand until a concentration of coagulated particles having a size of 1 $\mu$m or over is at 200,000 particles/0.5 cc of the slurry or below is used.

(4) A method of fabricating a semiconductor integrated circuit device comprises the steps of:
  (a) forming a groove in an element isolation region on a main surface of a wafer by etching the element isolation region on the main surface of the wafer by use, as a mask, of an oxidation-resistant insulating film formed on the main surface of the water;
  (b) forming a silicon oxide insulating film on the main surface of the wafer including the inside of the groove; and
  (c) subjecting the silicon oxide insulating film to chemical mechanical polishing through the oxidation-resistant insulating film as a stopper for polishing, so that the silicon oxide insulating film is selectively left inside the groove, thereby forming a polished, planarized insulating film isolation groove in the element isolation region on the main surface of the wafer, wherein, when the silicon oxide insulating film is subjected to chemical mechanical polishing, a polishing slurry obtained after being allowed to stand for 30 days or over is used.

In the practice of the invention, the term "chemical mechanical polishing (CMP)" refers to a manner of polishing where, while a polishing slurry is supplied, a surface to be polished is polished in contact with a polishing pad made of a relatively soft cloth-like sheet material by relative movement along the surface.

The term "polishing slurry" means a suspension of a liquid colloidal state wherein fine particles of an abrasive (dispersoid) are suspended in water and a chemical etchant (dispersion medium). The term "fine particles of an abrasive" means fine particles of silica, ceria, zirconia, alumina or the like.

The term "allowing a polishing slurry to stand" is intended to mean that a polishing slurry is, placed in a container and allowed to stand in a still condition without subjecting it to vibrations, agitation, heating or the like. More particularly, the polishing slurry obtained, for example, by mixing fumed silica, pure water and an alkaline chemical solution and removing foreign matter therefrom is filled in an about 1 m square cubic container and stored in a storehouse whose temperature is maintained at a relatively uniform level. In this sense, to convey a polishing slurry after it has been filled in a container does not satisfy the requirement of "allowing to stand" or standing in the practice of the invention. For example, it is just as much conveying to ship a polishing slurry placed in a container (tank) via an ocean by means of a vessel as it is to transport it via a general road by means of a vehicle, such as a truck.

The term "polished, planarized insulating film isolation groove" means an element isolation groove that is formed by selectively leaving, inside a groove, an insulating film whose surface is planarized by chemical mechanical polishing. Accordingly, an element isolation groove formed by merely depositing an insulating film inside the groove is different from the "polished, planarized insulating film isolation groove" used herein. In other words, an element isolation groove generally called SGI (shallow groove isolation) or STI (shallow trench isolation) corresponds to the "polished, planarized insulating film isolation groove" used herein.

In accordance with the present invention, the term "mass-production process in a wafer line" refers to a case where the throughput per day of a specific type of chemical mechanical polishing unit used in a wafer line is at least 25 wafers to 50 wafers or over, preferably 100 wafers or over, when calculated as an 8 inch square wafer.

As a matter of course, the limit number of wafers are in inverse proportion to the area of a water.

In the following embodiments, individual embodiments may be divided into a plurality of sections or embodiments for convenience's sake, if necessary. Unless otherwise indicated, they are not mutually independent, but one may be in the relation of variations, details or a supplemental statement of part or the whole of others.

In the following embodiments, where reference is made to specific numbers or parameters of elements (including the number, value, amount, range and the like), such specific numbers or parameters should not be construed as limiting unless indicated so, and except in the case where limitation is apparent, principally placed on the specific numbers or parameters. The use of a larger or smaller number of intended elements may be within the scope of the invention. The elements or steps set out in the following embodiments are not always essential unless indicated so or except in the case where they are principally, apparently essential.

Likewise, where reference is made particularly to the shape, positional relationship of elements or members and the like in the following embodiments, a substantially similar or analogous shape or positional relationship is within the scope of the invention unless indicated so, or except in the case where it should not be principally, apparently included. This is true of the numerical values and ranges indicated in the present specification.

The term "semiconductor integrated circuit device" used herein means not only those devices formed on a single crystal silicon substrate, but also those formed on other types of substrates including an SOI (silicon on insulator) substrate and a substrate for fabrication of a TFT (thin film transistor) liquid crystal unless otherwise indicated. The term "wafer" used herein means a single crystal silicon substrate (substantially in a disk form, in general), an SOI substrate, a glass substrate, other insulating, semi-insulating or semiconductor substrates, and combinations thereof.

DETAILED DESCRIPTION OF THE PREFERRED EMBODIMENTS

Figure 1:
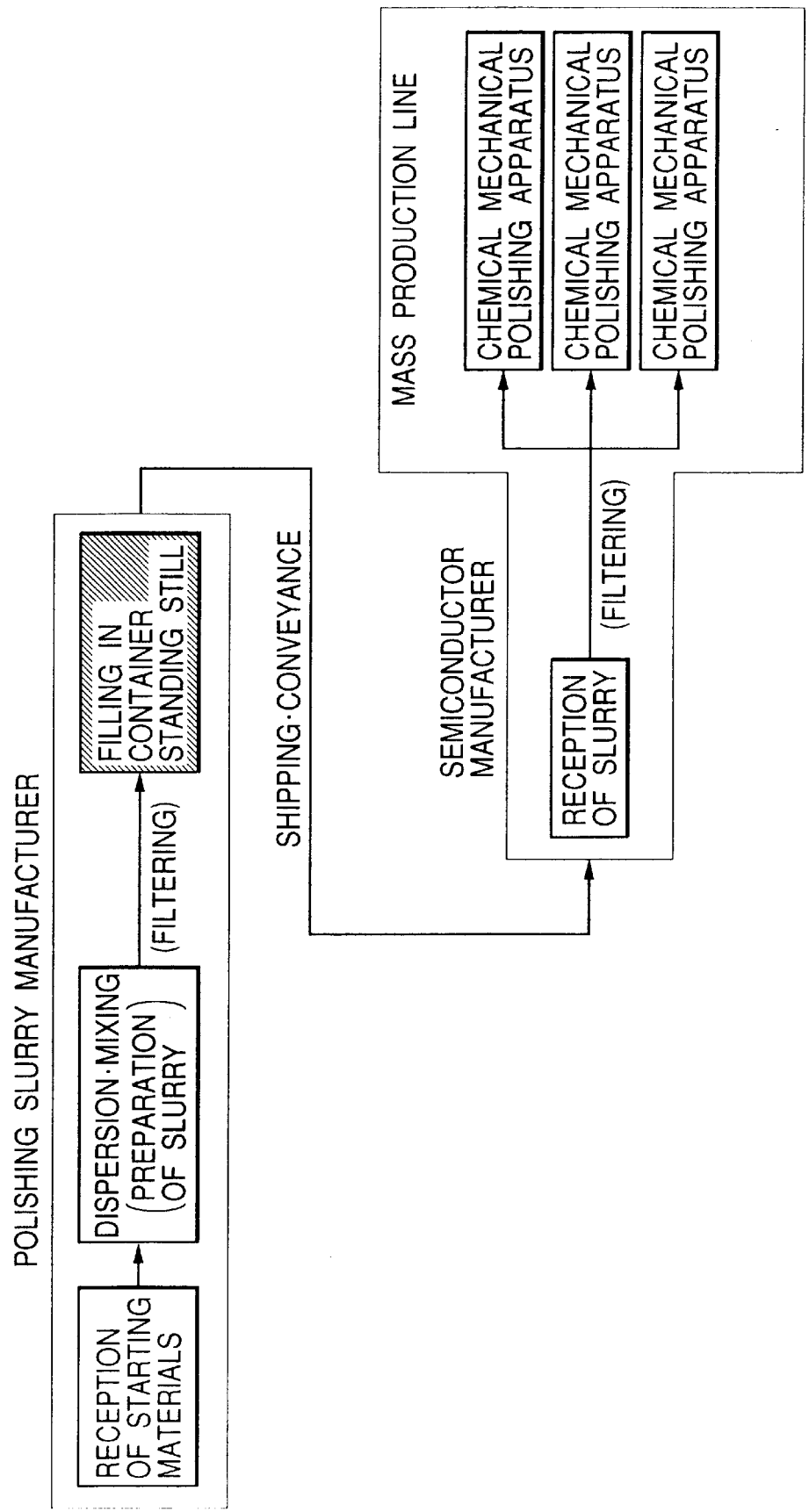
FIG. 1 is a process flow chart showing a series of operations for a polishing slurry being fed from commencement of manufacture to a chemical mechanical polishing unit of a semiconductor mass-production line.

Various embodiments of the present invention will be more particularly described with reference to the accompanying drawings. It will be noted that like reference numerals indicate like members or parts throughout the accompanying drawings illustrating the embodiments of the invention.
(Embodiment 1)

In this embodiment, the results of an experiment made by us are illustrated with respect to the relation between the time during which a polishing slurry is allowed to stand and the level of scratches caused in a wafer process.
Polishing Slurry:

FIG. 1 is a flow chart showing a series of operations using a polishing slurry covering the time from the commencement of its preparation until supply of the slurry to a chemical mechanical polishing unit of a semiconductor mass-production line.

In general, a manufacturer of a polishing slurry prepares the polishing slurry by dispersing simple silica particles (primary particles) having an average size of 20 nm to 40 nm, i.e. fumed silica, in pure water, and adding an alkaline chemical solution, such as ammonium hydroxide, to the dispersion so as to adjust its pH to approximately 10 to 11. Subsequently, particles of foreign matter or coarse defective primary particles, which are formed or incorporated during the course of the preparation process, are removed from the polishing slurry by means of a filter, followed by filling the polishing slurry in a container and allowing it to stand. Thereafter, the slurry is shipped and conveyed toward a semiconductor manufacturer.

The standing period used herein is a period of from the commencement of the standing after filling the slurry in the container until the inspection of the density of coagulated particles for shipping or until the commencement of movement to a transport means, such as a truck, for forwarding. On the other hand, a semiconductor manufacturer purchases a polishing slurry filled in a container from a slurry maker, and a required amount thereof is supplied to a chemical mechanical polishing unit of a wafer line on all such occasions in which there is a need to perform chemical mechanical polishing treatment. More particularly, the polishing slurry conveyed with a container for standing is pumped out from the standing and conveying container at a level of approximately 10 cm from the bottom of the container and is transferred into a tank for receiving the slurry in FIG. 1 (i.e. a tank having substantially the same shape and size as the tank for standing, e.g. a 1 m square cubic tank) without raising a cloud of precipitate. Thereafter, as shown in FIG. 1, the slurry is passed through a filter for removing relatively large-sized foreign matter (e.g. foreign matter having a size of 50 micrometers or over) occurring from a piping system, followed by feeding of the polishing slurry, for example, into 10 to 20 chemical mechanical polishing units (more or less units may be used) through the piping system. Alternatively, it is possible to set a receiving tank for each chemical mechanical polishing unit without use of such a centralized system as set out above. However, by use of the batch supply system, it becomes possible to continuously feed a slurry to a plurality of units in an amount corresponding to that needed for several hours to several days of use by one feeding operation, with the advantage that a stable slurry feed is enabled.

In this embodiment, there was used a polishing slurry comprising approximately 13 wt % of fumed silica as a polishing grain component, to which ammonium hydroxide ($NH_4OH$) is added so as to adjust the pH to about 11 (although sodium hydroxide or potassium hydroxide may be used as another type of alkaline chemical solution, ammonium hydroxide is advantageous in that an alkali metal is contained therein in a much reduced amount). Fumed silica contained in the polishing slurry has hydrophilic silanol groups (Si—OH) existing at the surface thereof. Accordingly, where silica particles are added to a dispersing medium, such as water, the particles mutually coagulate through the hydrogen bond and the van der Waals force between the particles via the silanol groups thereof, thereby forming coagulated particles (secondary particles) whose size is larger than that of the primary particles. Thus, the grain component in the polishing slurry used in an actual wafer polishing step is made of the coagulated particles (secondary particles). Particles that cause a problem in the practice of the invention among the coagulated particles are those coagulated particles (coarse coagulated particles) having a size of 1 $\mu$m or over, which cause microscratches.

The concentration of the coarse coagulated particles in the polishing slurry was measured by use of a size distribution measuring instrument for analysis of coagulated particles "AccuSizer Model 780" made by Particle Sizing System. This measuring instrument is based on the principle of a light-intercepting system and a light scattering system, wherein the number of pulses generated from particles passing through a measuring sensor is used to determine the number of particles.

Chemical Mechanical Polishing Unit

The chemical mechanical polishing unit used was of the type wherein a wafer was set on a polishing pad having a polishing slurry dropped thereon so that a surface of the wafer to be processed was faced downwards, and the polishing was performed under air-pressurized conditions. The polishing pad surface that was damaged due to the polishing was dressed with a diamond dresser and re-used. As the polishing pad, there was used a foamed urethane/urethane foam double-layered pad "IC14OOKGr", made by Rodel Nitta.

Scratches

Scratches can be broadly classified into a macroscratch and a microscratch. The feature of the macroscratch resides in defects crossing a wafer, and the macroscratch is mainly caused by diamond grains which have dropped off from a dresser. The microscratch, which presents a problem to be solved by the present invention, is one having a depth of approximately several tens of manometers and is a minute defect that can be observed by widening it through etching with dilute hydrofluoric acid ($HF:H_2O=1:99$). As stated hereinbefore, this microscratch is caused mainly by coarse coagulated particles having a size of 1 $\mu$m or over contained in the polishing slurry.

The evaluation on the microscratch was made in the following manner. After polishing a pattern-free silicon wafer (with a diameter of 20 cm) for approximately 1 minute by use of such a chemical mechanical polishing unit as set out above, the wafer was etched with the above-mentioned dilute hydrofluoric acid for several minutes to enlarge scratches, followed by classifying scratches by use of a laser irradiation defective inspector LS6510", made by Hitachi Electronics Engineering, Ltd.

Figure 2:
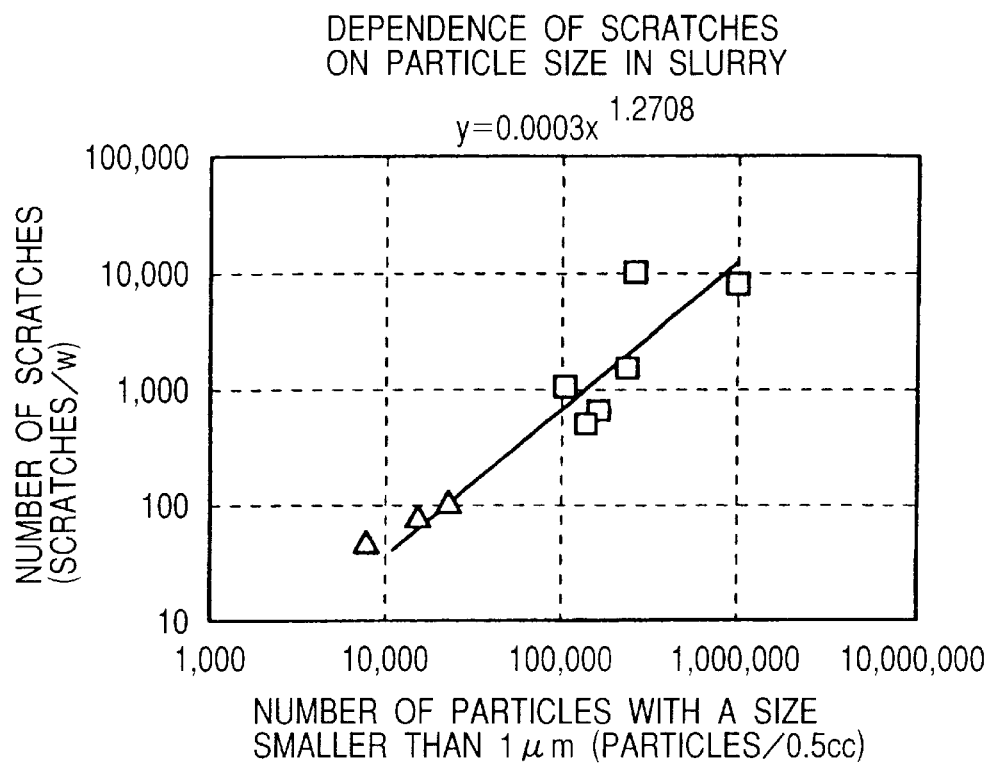
FIG. 2 is a graph showing the relation between the density of coagulated particles in a polishing slurry and the formation of microscratches.

The relation between the density of coagulated particles in a polishing slurry and the number of microscratches obtained in this experiment is shown in FIG. 2. The ordinate indicates the number of microscratches per wafer and the abscissa indicates the number of coagulated particles having a size of 1 $\mu$m or over contained in 0.5 cc of the slurry, each expressed in terms of a logarithm. It has been confirmed that, as shown in the figure, a lower density of coagulated particles in the polishing slurry results in a smaller number of microscratches occurring in the course of the chemical mechanical polishing process.

Next, the mechanism on how coagulated particles are formed in a polishing slurry and a method of reducing the number of coagulated particles in the slurry will be described.

Figure 3:
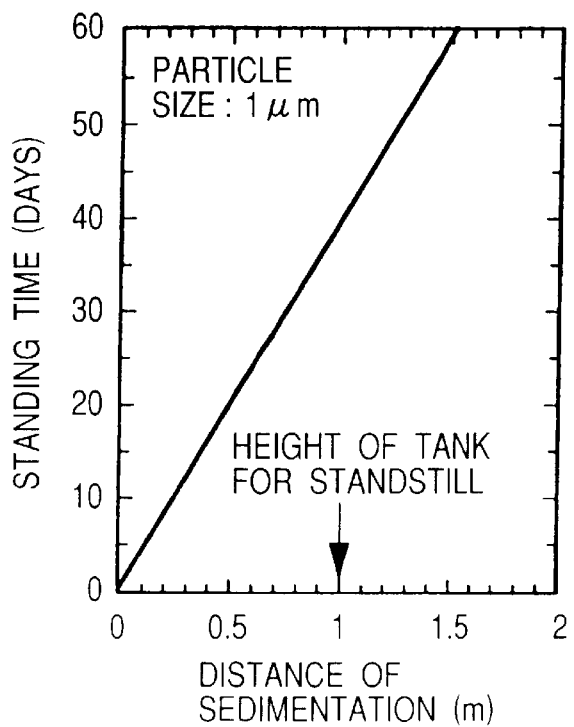
FIG. 3 is a graph showing the relation between the sedimentation rate of coagulated particles having a size of 1 $\mu$m or over in a polishing slurry and the standing time.

FIG. 3 shows a sedimentation rate of coagulated particles having a size of 1 $\mu$m or over when a polishing slurry is allowed to stand in a 1 m high container. In FIG. 3, the ordinate indicates the standing time and the abscissa indicates the sedimentation distance. It is assumed from the figure that the sedimentation of the coagulated particles by the height of 1 m takes at least 30 days or over, and usually, 40 days or over.

Figure 4:
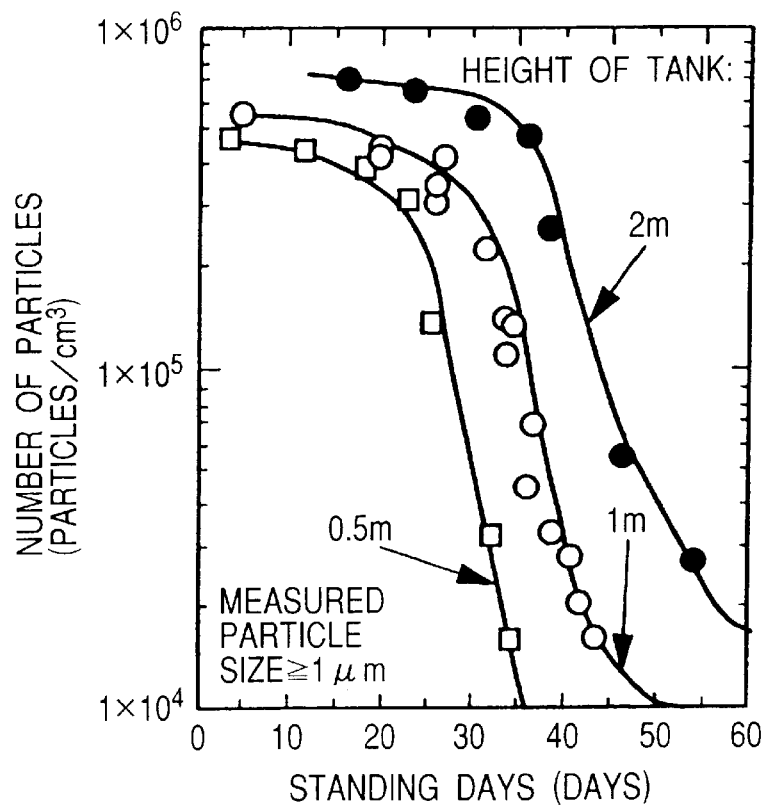
FIG. 4 is a graph showing the relation between the number of coagulated particles having a size of 1 $\mu$m or over in a polishing slurry and the standing time.

On the other hand, FIG. 4 shows the dependence of the standing time on the number of coagulated particles in a polishing slurry. In FIG. 4, the ordinate indicates the number of coagulated particles having a size of 1 $\mu$m or over in 1 $cm^3$ of a polishing slurry and the abscissa indicates the standing time of the polishing slurry. The measurement was made at the heights of the containers of 0.5 m, 1 m and 2 m used for the standing of the polishing slurry, respectively. As shown in the figure, during the time from commencement of the standing until after approximately 30 days, the number of coagulated particles was reduced only slightly, after which an abrupt reduction in number took place. More particularly, if only a sedimentation phenomenon of particles appears during the standing, the number has to be simply reduced, which was not so in practice. The following model of behavior is considered as a reason for this.

Figure 5:
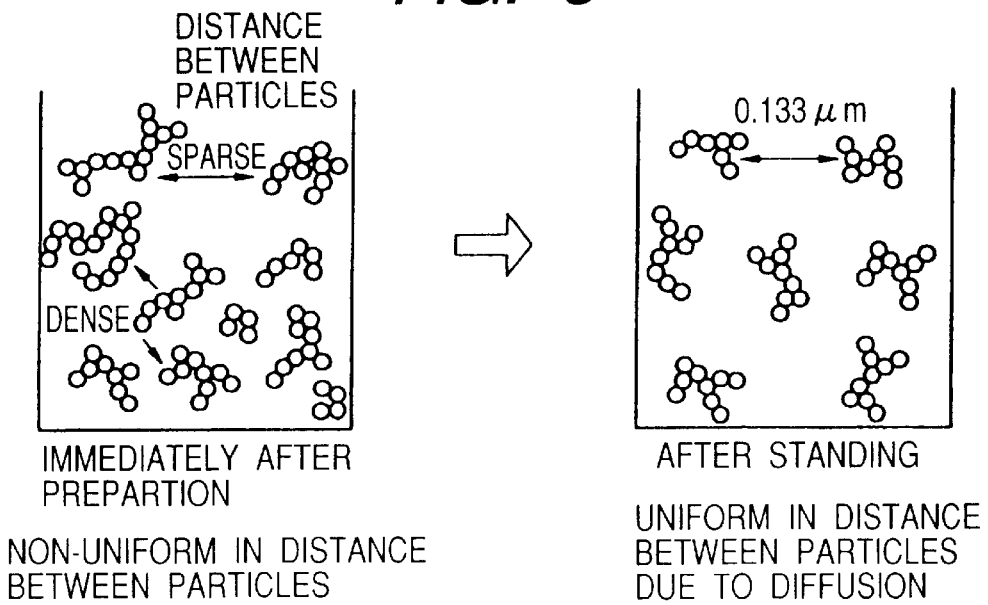
FIG. 5 is a diagram showing a dispersed state of coagulated particles in a polishing slurry.

As shown in FIG. 5, the slurry obtained immediately after its preparation has a non-uniform concentration distribution of coagulated particles, so that there are short regions and long regions with respect to the distance between adjacent coagulated particles in the slurry. Coagulated particles having an average size of approximately 13 nm, which occupy a major proportion of particles in the polishing slurry, undergo the Brownian movement at a diffusion rate of approximately 2.67 $\mu$m/second, under which, if the distance between particles is shorter than a particle size, the mutual collision of the particles is invariably repeated. Thus, the increase in number of coagulated particles caused by the collision occurs concurrently with the decrease in number of coagulated particles caused by the sedimentation. In this connection, however, if the distance between particles is longer than a particle size, a particle undergoing the Brownian movement is likely to be free from or pass through other particles, so that the number of collisions with other particles is reduced, with a reduced possibility of mutual coagulation of particles.

When the distance between particles having such a size as mentioned above in a polishing slurry having a concentration of coagulated particles of 13% is calculated, it should be at 0.138 $\mu$m in order to permit dispersion at uniform distances. Accordingly, in the event that the distance between adjacent particles for all the coagulated particles is at the value indicated above, coagulation ceases. It is considered that the results of the measurements shown in FIG. 4 are obtained for the reason that it takes a certain time before the distance between particles is kept constant, and at the time when coagulation is settled, a reduction in the number of particles by sedimentation apparently starts.

In view of the experimental results stated above, it has been found that there is a clear interrelation between the standing time of the polishing slurry and the occurrence of microscratches, and that in order to suppress the occurrence of microscratches, it is effective to allow the polishing slurry to stand until the concentration of coagulated particles lowers.

Whether or not a polishing slurry allowed to stand is usable should be judged in the following manner: the concentration of coarse coagulated particles is measured by use of such a measuring instrument (AccuSizer Model 780) as mentioned above, so as to confirm the concentration at a level not larger than a predetermined value. More particularly, from the results shown in FIGS. 2, 3, it has been found that with the case, for example, where a polishing slurry is placed in a 1 m high columnar standing container after preparation thereof, the slurry is allowed to stand for at least 30 days or more, preferably 40 days or more, and more preferably 50 days or more, to confirm the number of coagulated particles having a size of 1 $\mu$m or more and present in 0.5 cc of the polishing slurry at 200,000 or below, preferably 50,000 or below, and more preferably 20,000 or below, after which, if such a slurry is used, the occurrence of microscratches can be suppressed to a negligible level.

The standing of a polishing slurry means that a polishing slurry is filled in a container and is allowed to stand in a still condition without being subjected to such conditions as of vibrations, agitation, heating (accompanying a material transport via convection) or the like. Accordingly, the act of conveying a polishing slurry after filling in a container does not satisfy the requirement for standing as used herein. The standing of a polishing slurry is usually carried out within a temperature range of 5° C. to 35° C., preferably at a temperature of approximately 20° C.

Where a polishing slurry that is allowed to stand over such a period of time as defined hereinabove is drawn out from a container and transported or supplied to a chemical mechanical polishing unit, a supernatant portion at a distance of 5 cm or more, preferably 10 cm or more, from the bottom of the container should be taken out in order to avoid incorporation of foreign matter and coarse coagulated particles that have settled to the bottom of the container. It is effective when the polishing slurry taken out from the container is passed through a filter and subsequently fed into a chemical mechanical polishing unit.

The coagulated particles in the polishing slurry are reduced in concentration with repeated coagulation and sedimentation, so that the concentration may differ depending on the size and height of the container for the same standing conditions. Accordingly, a polishing slurry whose density of coagulated particles is reduced can be supplied to a chemical mechanical polishing unit by changing the drawing-out position depending on the standing time. It is considered that if the height of the container for standing is halved, a necessary standing time can be proportionally halved.

Once a slurry is allowed to stand over a long time (e.g. over 30 days) to permit coagulated particles to be fixed as a sedimentation layer at the bottom of a tank, stirring to a slight degree caused by conveyance or the like usually presents little problem. This may be true of shipment, such as with a vessel.

For the standing of a polishing slurry, it is desirable to specify the date of manufacture and a usable time limit on the container of a polishing slurry and in an instruction manual.

It is as a matter of course that after a semiconductor manufacturer has purchased a polishing slurry that has not undergone standing over such a period as defined hereinabove or has never been allowed to stand over a given long period, the slurry may be used after standing (for example, over 30 days) In this connection, for example, after the maker of the polishing slurry has allowed the polishing slurry to stand over 15 days, and the slurry is then transported to a semiconductor manufacturer, it may be necessary for the semiconductor manufacturer to allow the slurry to stand again over 30 days or more. In this embodiment, an instance where a slurry is allowed to stand over a predetermined long time mainly at the side of a polishing slurry maker is illustrated, however it is not necessary for a slurry to stand over a long time (e.g. over 30 days or over) at the location of the polishing slurry maker, but it may be subjected to long-time standing at the location of the manufacturer of the semiconductor integrated circuit or semiconductor device. In doing so, however, if a polishing slurry corresponding to one 1 m square container is consumed at a semiconductor plant, a space for placing 30 standing containers becomes necessary, which represents a great inconvenience to the semiconductor manufacturer. On the other hand, however, a gigantic standing space at the location of the maker of the polishing slurry can be partly shared with a manufacturer for semiconductor devices.

(Embodiment 2)

An embodiment which is applied to a process of manufacture of a DRAM (dynamic random access memory) will be described with reference to FIGS. 6 to 25. It will be noted that a polishing slurry used in this embodiment is one that is fundamentally treated in the same manner as described with reference to Embodiment 1, and is not repeatedly described again unless otherwise indicated.

Figure 6:
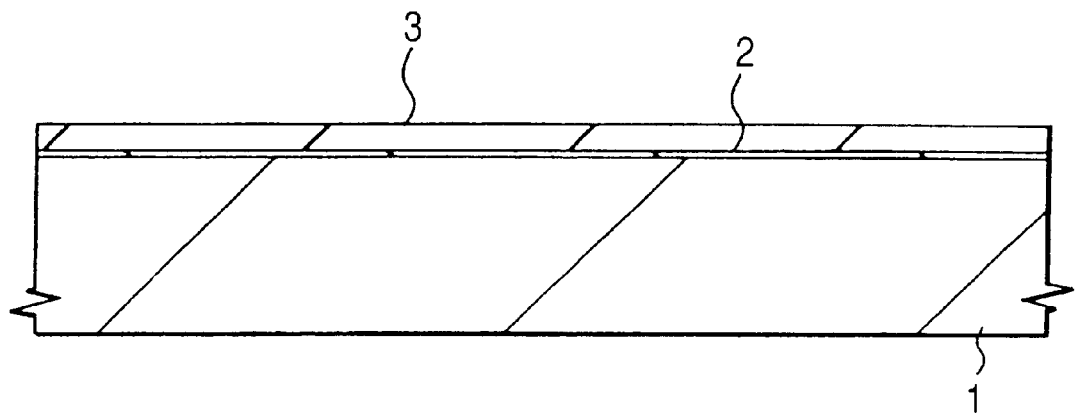
FIG. 6 is a sectional view of an essential part of a silicon substrate showing a step in the method of fabricating a semiconductor -integrated circuit device according to one embodiment of the invention.

As shown in FIG. 6, a substrate (wafer) 1 made, for example, of p-type single crystal silicon having a specific resistance of from approximately 1 to 10 $\Omega$cm is thermally oxidized at about 850° C. to form a thin silicon oxide film 2 having a thickness of approximately 10 nm on the surface thereof. Thereafter, a silicon nitride film 3 having a thickness of approximately 140 nm is deposited on the upper portion of the silicon oxide film 2 according to a CVD method. The silicon nitride film 3 is used as a mask when the substrate 1 is etched at an element isolation region thereof to form a groove. The silicon nitride film 3 has such properties as not to be susceptible to oxidation and is also used as a mask for preventing the surface of the lower substrate 1 from oxidizing. The silicon oxide film 2 provided beneath the silicon nitride film 3 is formed so as to mitigate a stress occurring at the interface between the substrate 1 and the silicon nitride film 3, thereby preventing occurrence of defects, such as dislocation, on the surface of the substrate, as would be caused by the stress.

Figure 7:
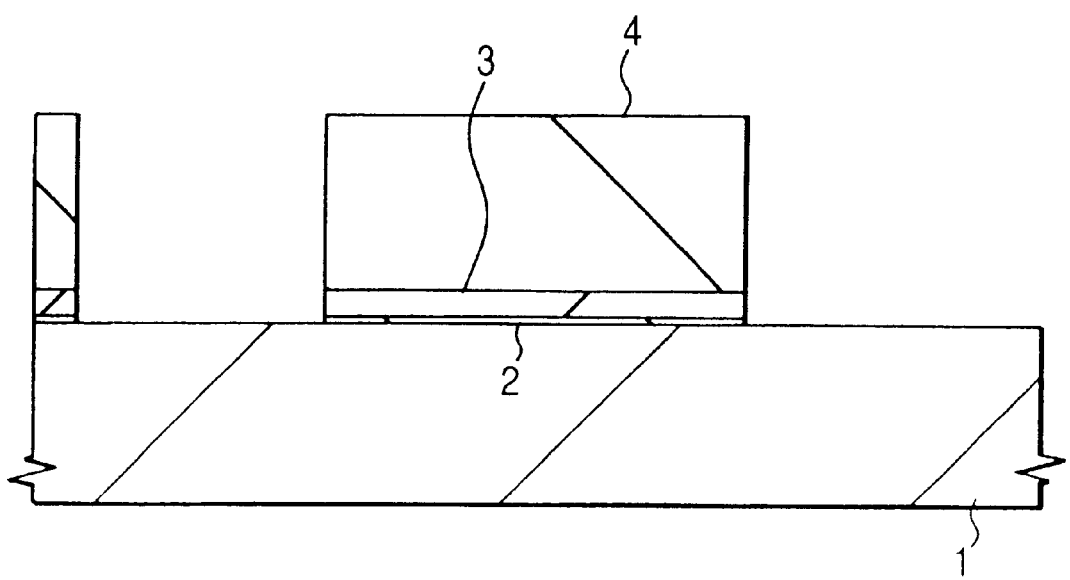
FIG. 7 is a sectional view of an essential part of a silicon substrate showing a step in the method for fabricating a semiconductor integrated circuit device according to one embodiment of the invention.
Figure 8:
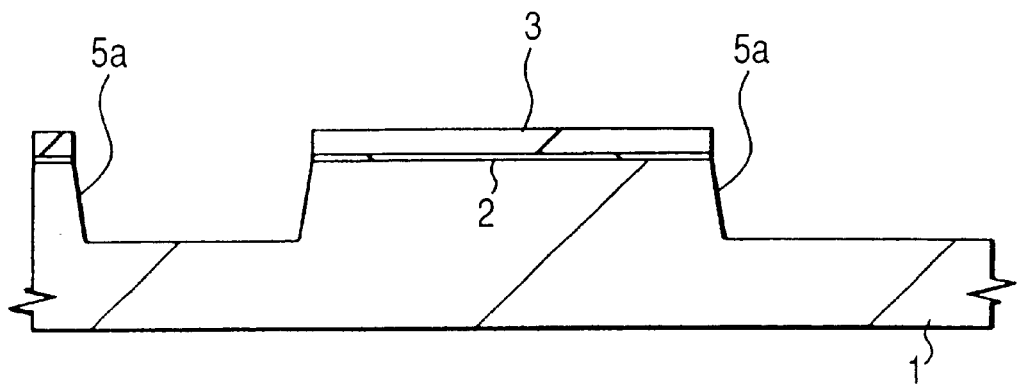
FIG. 8 is a sectional view of an essential part of a silicon substrate showing a step in the method of fabricating a semiconductor integrated circuit device according to one embodiment of the invention.

Next, as shown in FIG. 7, after selective removal the silicon nitride film 3 and the lower silicon oxide film 2 at the element isolation region by dry etching using a photoresist film 4 as a mask, a groove 5a having a depth of approximately 350 to 400 nm is formed at the element isolation region of the substrate 1 by dry etching using the silicon nitride film 3 as a mask.

Figure 9:
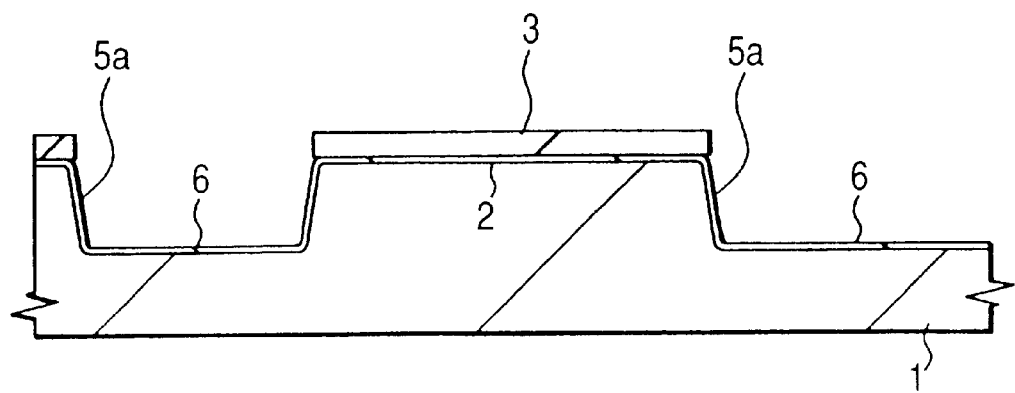
FIG. 9 is a sectional view of an essential part of a silicon substrate showing a step in the method of fabricating a semiconductor integrated circuit device according to one embodiment of the invention.

Thereafter, as shown in FIG. 9, the substrate 1 is thermally oxidized at about 800° C. to 1000° C. to form a thin silicon oxide film 6 having a thickness of approximately 10 nm on the inner walls of the groove 5a. This silicon oxide film 6 is formed so as to recover the damage of dry etching established at the inner walls of the groove 5a and also to mitigate a stress occurring at the interface between a silicon oxide film 7 buried inside the groove 5a in a subsequent step and the substrate 1.

Figure 10:
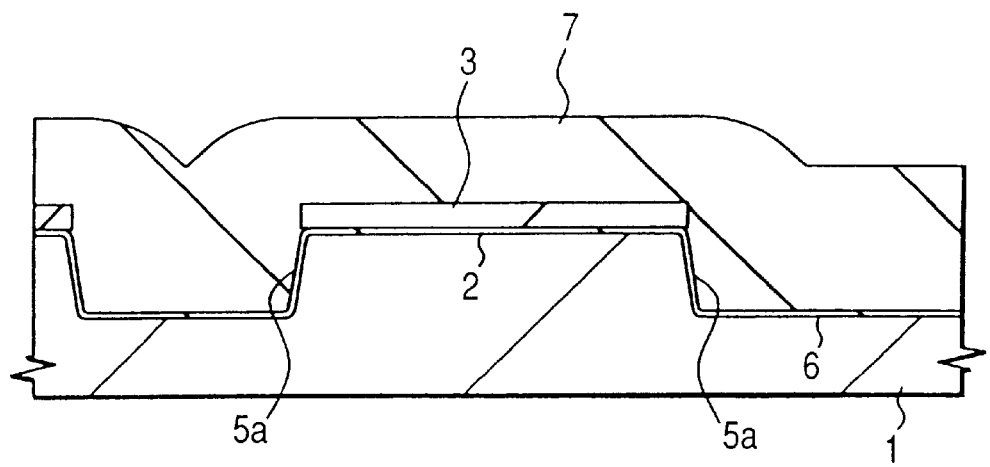
FIG. 10 is a sectional view of an essential part of a silicon substrate showing a step in the method of fabricating a semiconductor integrated circuit device according to one embodiment of the invention.

Next, as shown in FIG. 10, a silicon oxide film 7 is deposited on the substrate 1 including the inside of the groove 5a by a CVD method. This silicon oxide film 7 is deposited to a thickness larger than the depth of the groove 5a (e.g. a thickness of approximately 500 to 600 nm) so that the silicon oxide film 7 is buried fully in the groove 5a without any space therein. The silicon oxide film 7 is formed by a film-forming method ensuring a good step coverage like a silicon oxide film formed, for example, by use of oxygen and tetraethoxysilane ($(C_2H_5)_4$ Si).

Figure 11:
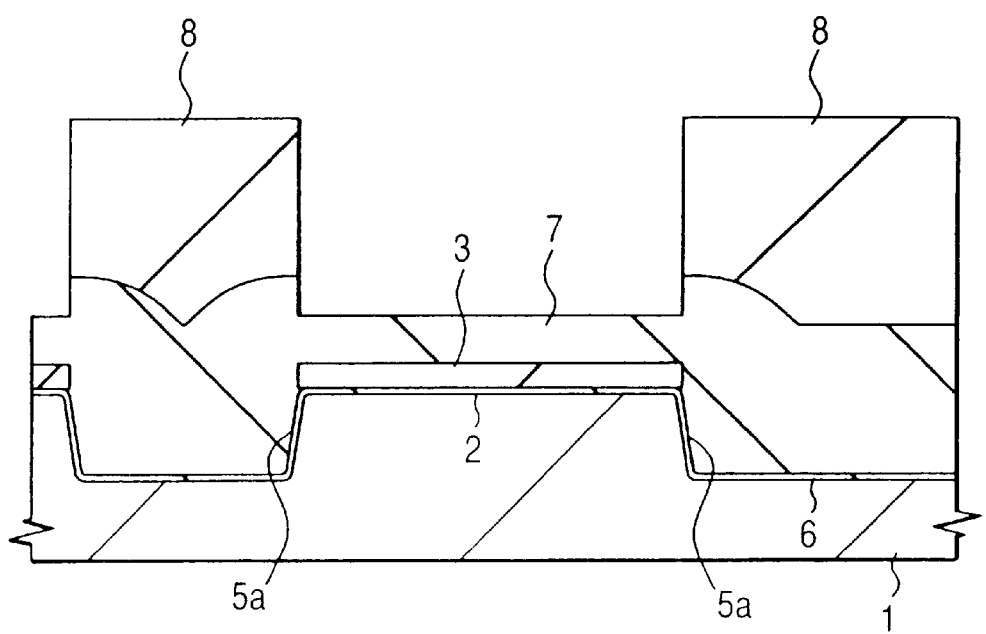
FIG. 11 is a sectional view of an essential part of a silicon substrate showing a step in the method of fabricating a semiconductor integrated circuit device according to one embodiment of the invention.

Thereafter, the substrate 1 is thermally oxidized at about 1000° C. and densified to improve the properties of the silicon oxide film 7 buried in the groove 5a, after which, as shown in FIG. 11, the silicon oxide film 7 provided on the silicon nitride film 3 is dry etched through a mask of a photoresist film 8 formed over the groove 5a to make a smaller film thickness thereof. This dry etching is performed so that the surface of the silicon oxide is substantially at the same height as the upper portion of the groove 5a and the upper portion of the silicon nitride film 3.

Figure 12:
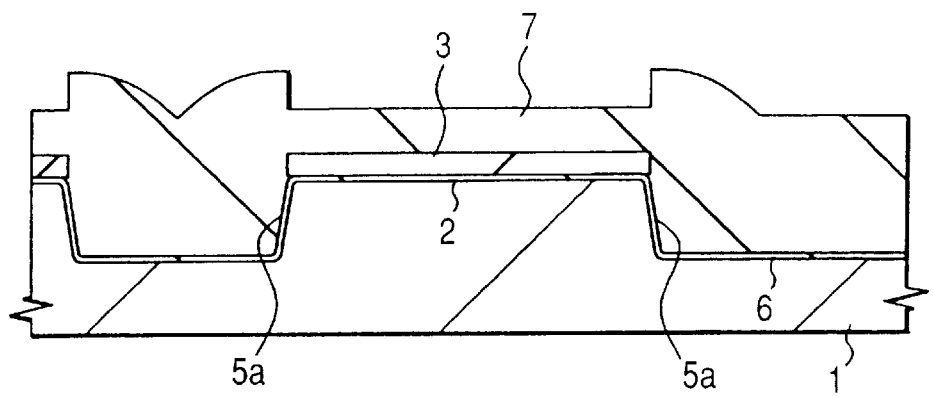
FIG. 12 is a sectional view of an essential part of a silicon substrate showing a step in the method of fabricating a semiconductor integrated circuit device according to one embodiment of the invention.

As shown in FIG. 12, after removal of the photoresist film 8 from the upper portion of the silicon oxide film 7, the silicon oxide film 7 is subjected to chemical mechanical polishing.

Figure 13:
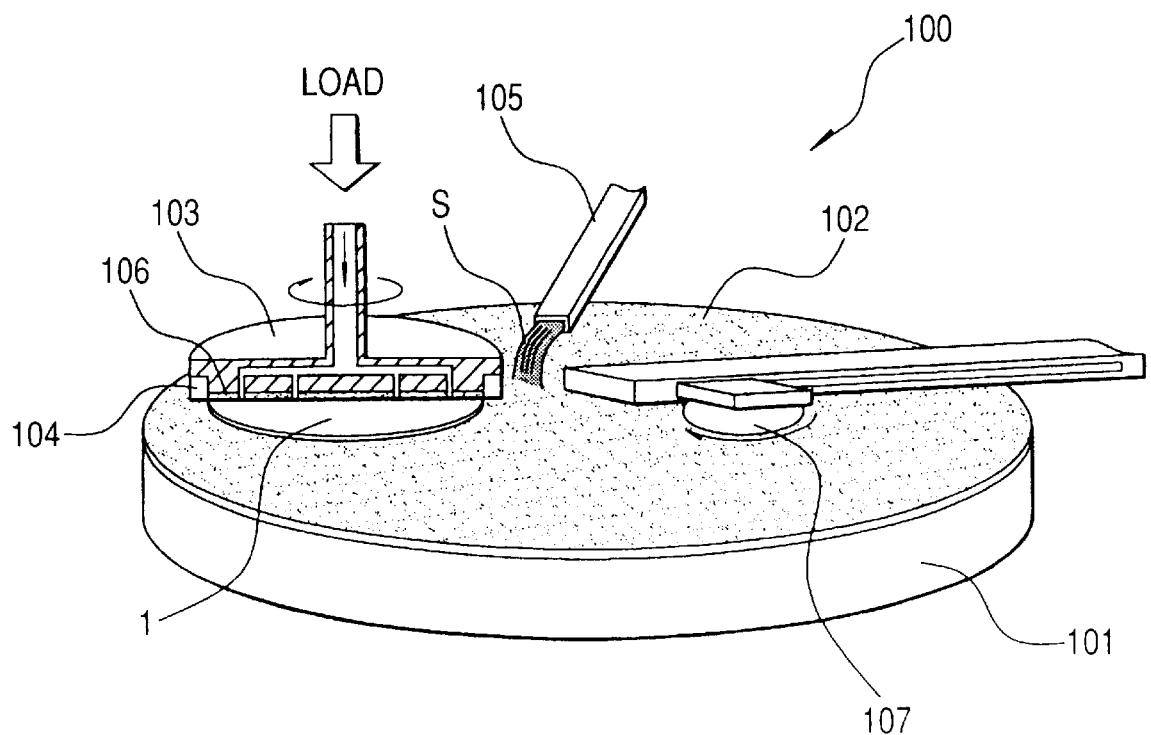
FIG. 13 is a schematic perspective view showing a processing unit of a chemical mechanical polishing unit.

FIG. 13 is a schematic view showing a processing unit of a chemical mechanical polishing device 100 used for polishing of the silicon oxide film 7. As shown, the processing unit of the chemical mechanical polishing device 100 has a stool 101 for polishing a wafer (substrate) 1. The stool 101 can be horizontally rotated by means of a drive mechanism that is not shown. A polishing pad 102 having a multitude of pores and is made of a synthetic resin such as polyurethane is attached to the upper surface of the stool 101.

A wafer carrier 103, which can be vertically moved and rotated within a horizontal plane by means of a drive mechanism that is not shown, is set above the stool 101. The wafer 1 having a main surface (i.e. a surface to be polished) facing downwards is held by means of a retainer ring 104 and a membrane 106 provided at a lower end of the wafer carrier 103, and it is pressed against the polishing pad 102 with a given load. A polishing slurry S is supplied through a slurry feed pipe 105 located between the surface of the polishing pad 102 and the surface of the wafer to be polished, and the surface of the wafer 1 to be polished is chemically and mechanically polished.

A dresser 107, which is moved vertically and rotated horizontally by means of a drive mechanism that is not shown, is set above the stool 101. A base of electro-deposited diamond particles is attached at a lower end of the dresser 107, and the surface of the polishing pad 102 is periodically cut off by this base in order to prevent clogging with abrasive grains.

In this embodiment, the silicon oxide film 7 was polished by use of a polishing slurry (S) which had been allowed to stand f or a time sufficient to permit the number of coagulated particles having a size of 1 μm or more at 20,000 particles or below/0.5 cc. The polishing conditions were set, for example, at a load=250 g/cm$^2$, revolutions of the wafer carrier=30 r.p.m., revolutions of the stool=25 r.p.m., and a flow rate of the slurry=200 cc/minute. This polishing was performed using the silicon nitride film 3 as a stopper and was completed at the time when the thickness of the silicon nitride film 3 was reduced to 50 nm.

Figure 14:
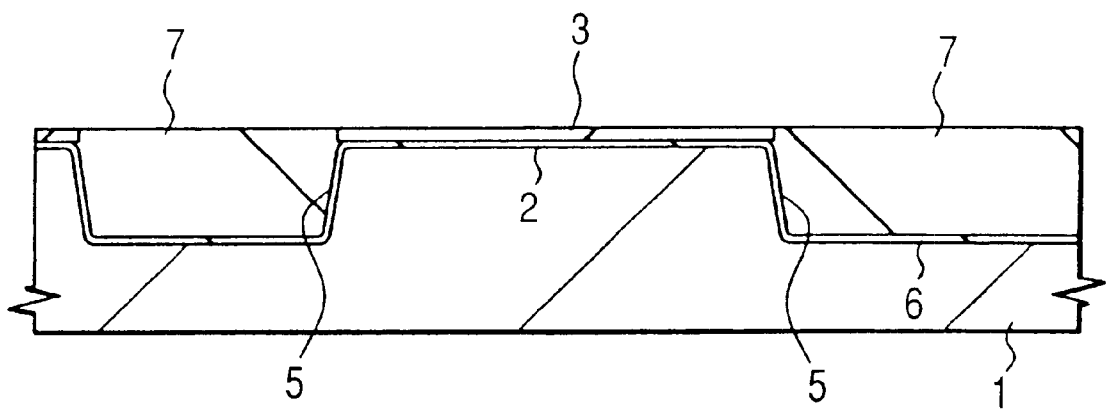
FIG. 14 is a sectional view of an essential part of a silicon substrate showing a step in the method of fabricating a semiconductor integrated circuit device according to one embodiment of the invention.

As shown in FIG. 14, an element isolation groove 5 is formed in the element isolation region at the main surface of the substrate (wafer) 1 after completion of these steps.

Figure 15:
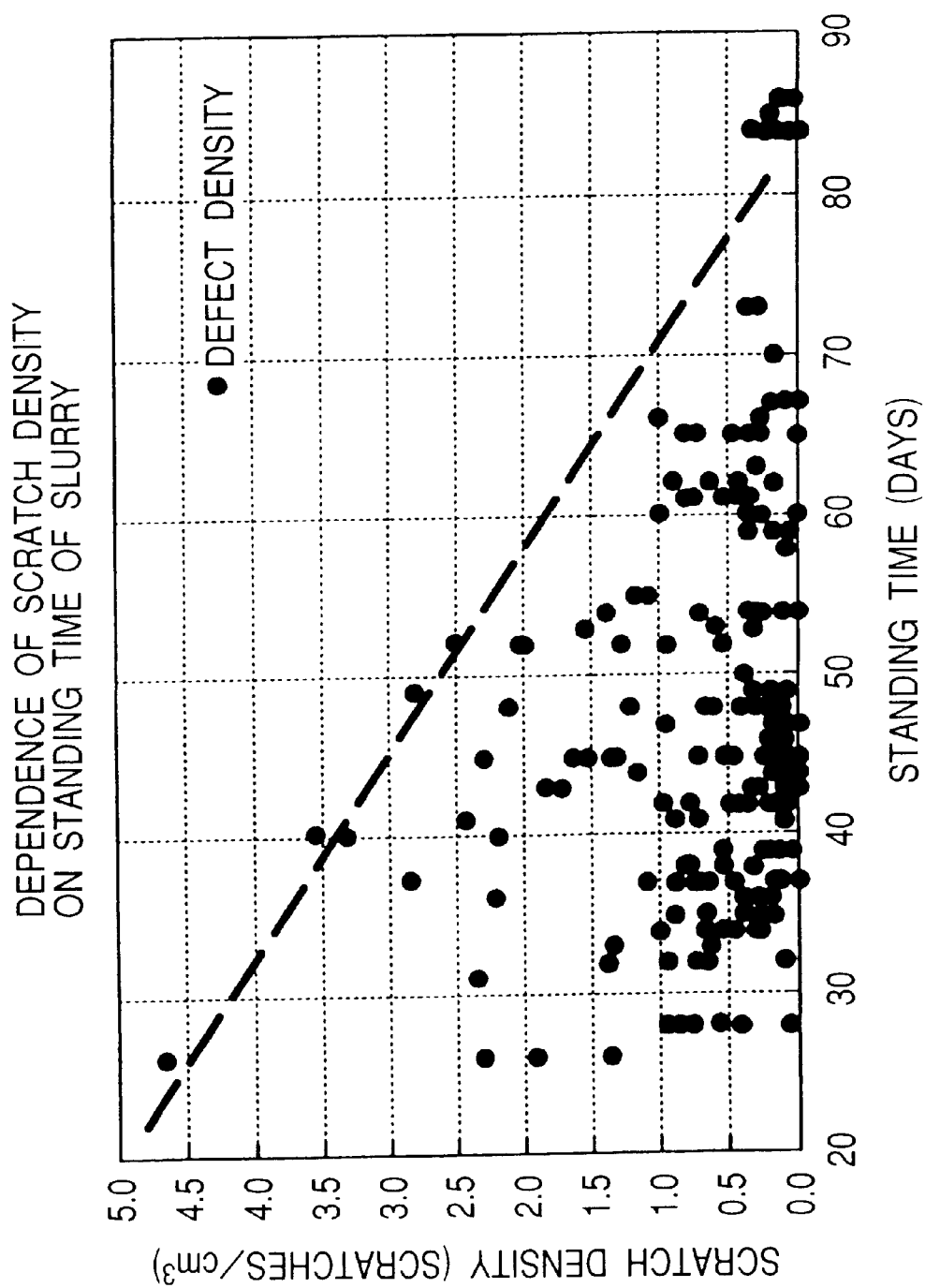
FIG. 15 is a graph showing the relation between the standing time of a polishing slurry and the density of microscratches.

FIG. 15 shows the relation between the density of microscratches occurring in the polishing step and the standing time of the polishing slurry (S) As shown, the density of microscratches could be reduced when the polishing slurry (S) is allowed to stand over at least 30 days or more, preferably 40 days or more, more preferably 50 days or more.

Figure 16:
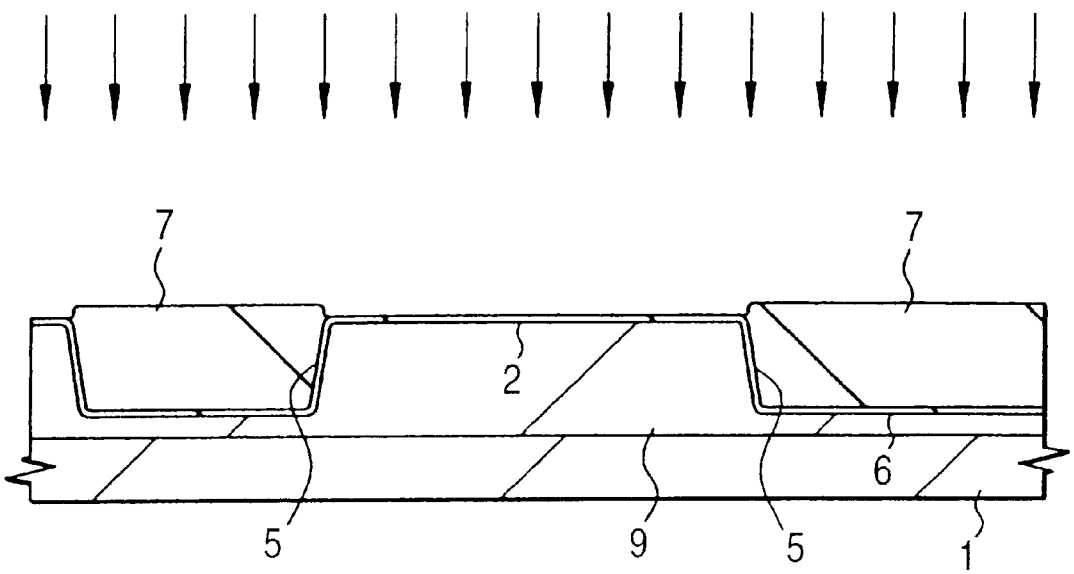
FIG. 16 is a sectional view of an essential part of a silicon substrate showing a step in the method of fabricating a semiconductor integrated circuit device according to one embodiment of the invention.
Figure 17:
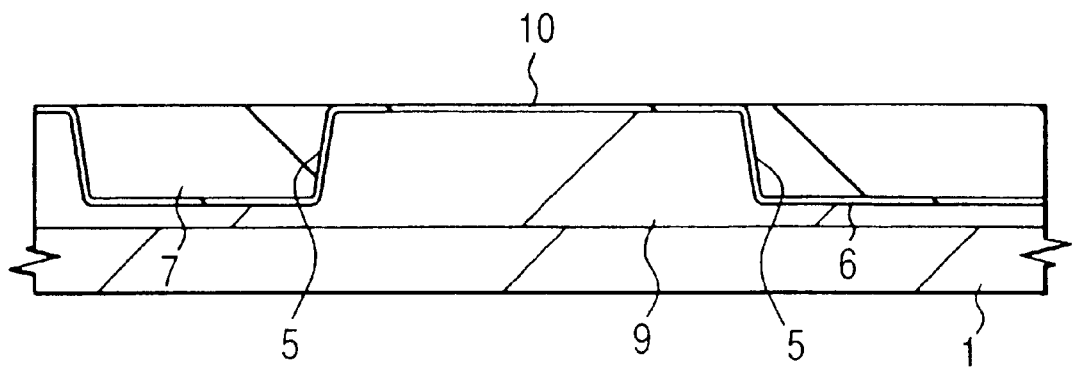
FIG. 17 is a sectional view of an essential part of a silicon substrate showing a step in the method of fabricating a semiconductor integrated circuit device according to one embodiment of the invention.

Next, an etchant, such as hot phosphoric acid, is used to remove the silicon nitride film 3, after which, as shown in FIG. 16, boron (B) is ion implanted into the substrate to form a p-type well 9. Subsequently, the silicon oxide film 2 is removed from the surf ace of the substrate 1 by wet etching using hydrofluoric acid. Thereafter, as shown in FIG. 17, the substrate 1 is thermally oxidized at about 800 to 850° C. to form a clean gate oxide film 10 on the surface thereof.

Figure 18:
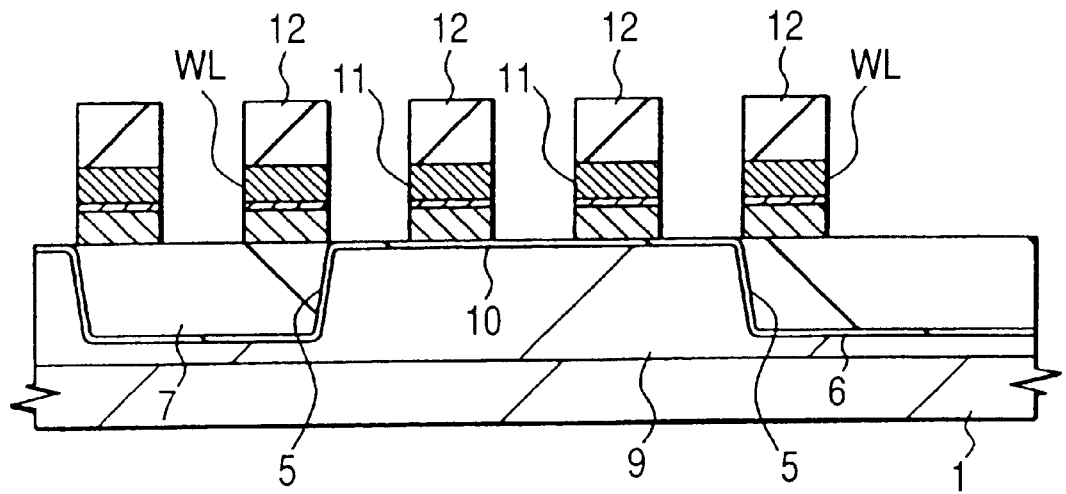
FIG. 18 is a sectional view of an essential part of a silicon substrate showing a step in the method of fabricating a semiconductor integrated circuit device according to one embodiment of the invention.

As shown in FIG. 18, a gate electrode 11 (word line WL) is formed on the gate oxide film 10. The gate electrode 11 (word line WL) is formed, for example, by depositing a phosphorus-doped polysilicon film on the gate oxide film 10 by a CVD method, further depositing a WN film and a W film thereon by a sputtering method, and still further depositing a silicon nitride film 12 by a CVD method, followed by patterning these films by etching through a photoresist film (not shown) as a mask.

Figure 19:
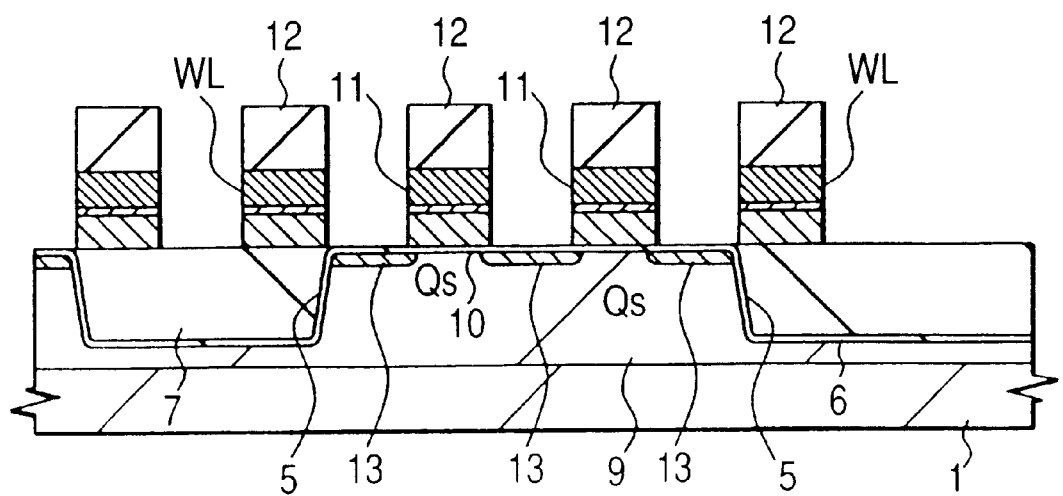
FIG. 19 is a sectional view of an essential part of a silicon substrate showing a step in the method of fabricating a semiconductor integrated circuit device according to one embodiment of the invention.

Thereafter, as shown in FIG. 19, phosphorus (P) or arsenic (As) is ion implanted into the p-type well 9 to form n-type semiconductive regions 13 (source, drain). According to the steps set out hereinabove, there can be substantially completed MISFETQs for memory cell selection of a DRAM.

Figure 20:
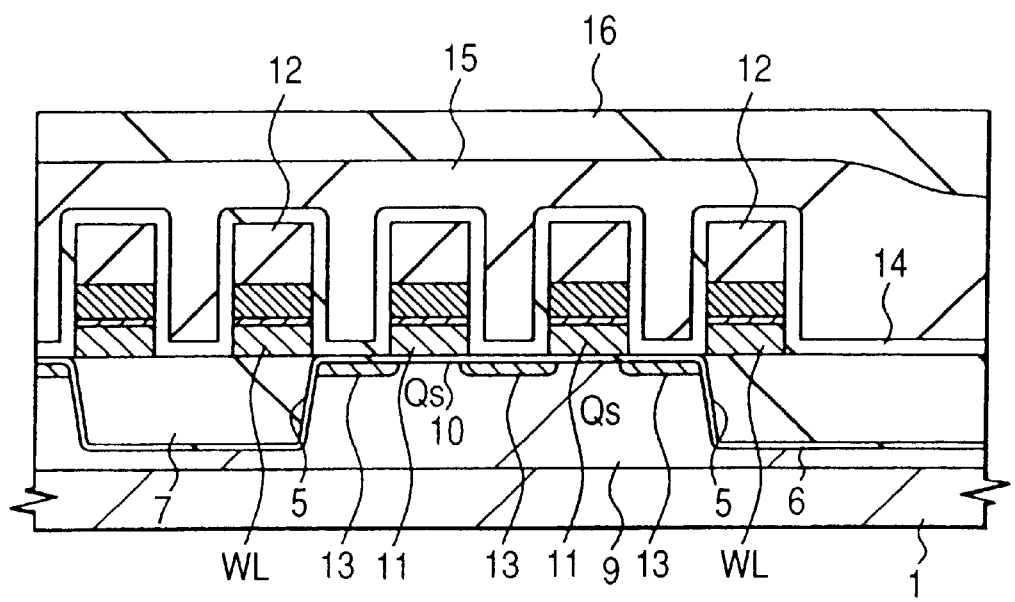
FIG. 20 is a sectional view of an essential part of a silicon substrate showing a step in the method of fabricating a semiconductor integrated circuit device according to one embodiment of the invention.

Next, as shown in FIG. 20, a silicon nitride film 14 is deposited over the substrate 1 by a CVD method and a spin-on-glass film 15 is spin-coated on the silicon nitride film 14, followed by deposition of a silicon oxide film 16 on the spin-on-glass film 15.

Figure 21:
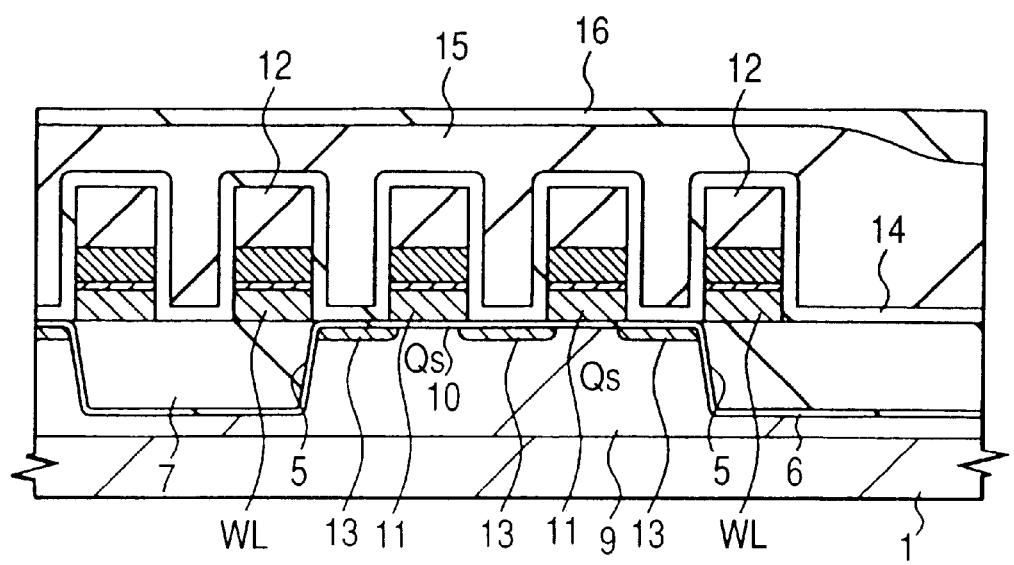
FIG. 21 is a sectional view of an essential part of a silicon substrate showing a step in the method of fabricating a semiconductor integrated circuit device according to one embodiment of the invention.

As shown in FIG. 21, the silicon oxide film 16 is polished by a chemical mechanical polishing method to planarize the surface thereof. If microscratches are formed in the silicon oxide film in this polishing step so that part thereof reaches the lower spin-on-glass film 15, the scratches in the spin-on-glass film 15 are enlarged by cleaning with hydrofluoric acid in a subsequent step. In this condition, when plugs 19 are, respectively, buried in contact holes formed in the spin-on-glass film 15 in a later step, there is the possibility that the plugs 19 are mutually short-circuited via the scratch.

Accordingly, in this polishing step, the silicon oxide film 14 is polished by use of the polishing slurry (S) that has been allowed to stand until the number of coagulated particles having a size of 1 μm or over is at a level of 20,000 particles or below/0.5 cc, thereby not permitting microscratches to occur in the silicon oxide film 16.

Figure 22:
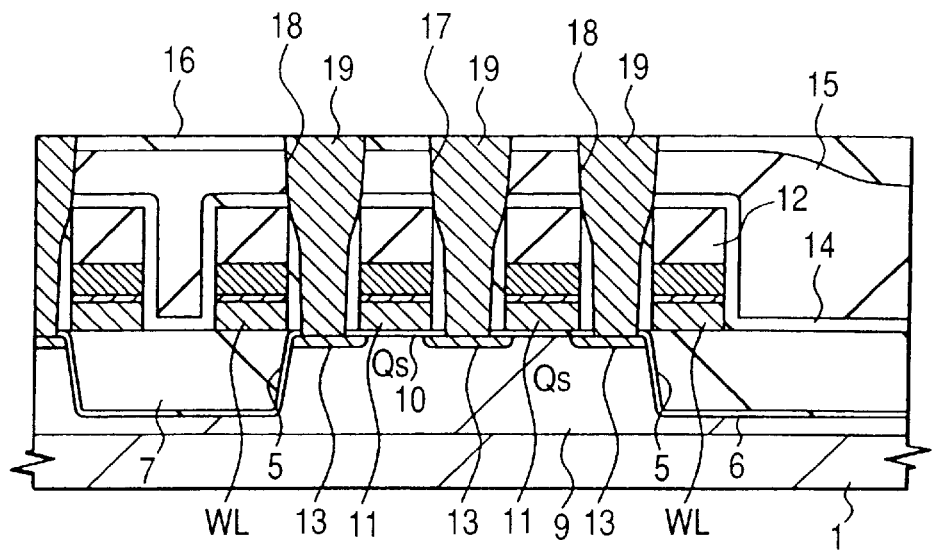
FIG. 22 is a sectional view of an essential part of a silicon substrate showing a step in the method of fabricating a semiconductor integrated circuit device according to one embodiment of the invention.

As shown in FIG. 22, the silicon oxide film 16, the, spin-on-glass film 15 and the silicon nitride film 14 are, respectively, dry-etched through a mask of a photoresist film (not shown), thereby forming contact holes 17, 18 on the upper portion of the n-type semiconductive regions 13 (source, drain). After cleaning the insides of the contact holes 17, 18 with hydrofluoric acid, plugs 19 are formed inside the contact holes 17, 18, respectively. For the formation of the plugs 19, for example, a low resistance polysilicon film doped with phosphorus (P) is deposited inside the contact holes 17, 18 and on the silicon oxide film 16, respectively, after which an unnecessary portion of the polysilicon film is removed from the silicon oxide film by dry etching (or by a chemical mechanical polishing method).

Figure 23:
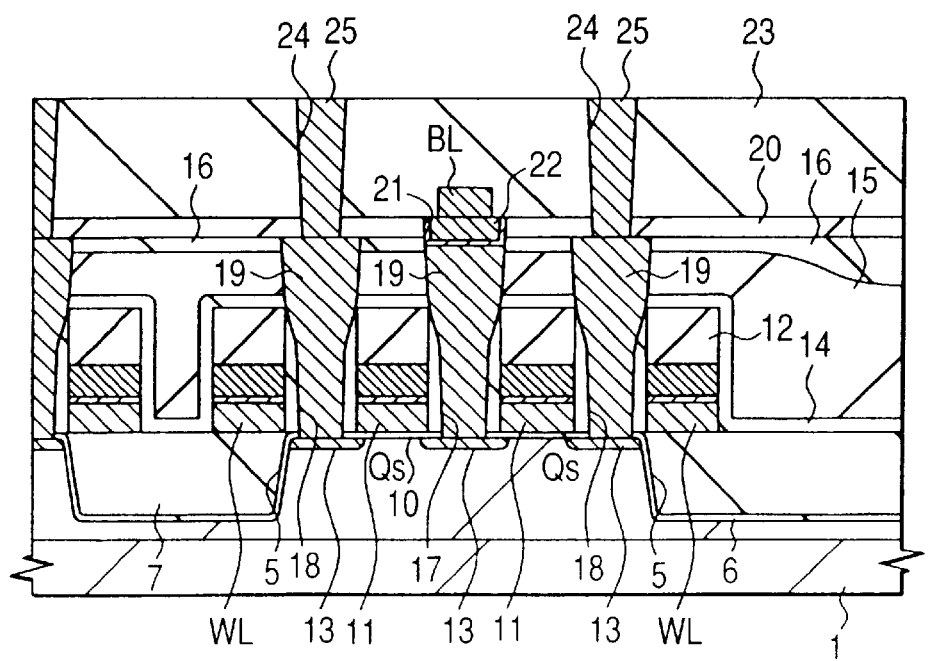
FIG. 23 is a sectional view of an essential part of a silicon substrate showing a step in the method of fabricating a semiconductor integrated circuit device according to one embodiment of the invention.

Thereafter, as shown in FIG. 23, a silicon oxide film 20 is deposited on the silicon oxide film 16 by a CVD method, and the silicon oxide film 20 on the contact hole 19 is etched to form a through-hole 21, followed by formation of a plug 22 in the through-hole 21. The plug 22 is formed, for example, by depositing a TiN (titanium nitride) film and a W (tungsten) film on the silicon oxide film 20, followed by removing unnecessary portions of the W film and TiN film on the silicon oxide film 20 by a chemical mechanical polishing method. Subsequently, the W film deposited on the silicon oxide film 20 by a sputtering method is subjected to patterning to form a bit line BL on the plug 22.

A silicon oxide film 23 is deposited over the bit line BL by a CVD method, and the silicon oxide film 23 on the contact hole 18 is etched to form a through-hole 24, followed by forming a plug 25 in the through-hole 48. For the formation of the plug 25, for example, a low resistance polysilicon film doped with phosphorus (El) is deposited inside the through-hole 24 and on the silicon oxide film 23 by a CVD method, and an unnecessary portion of the polysilicon film on the silicon oxide film is removed by dry-etching (or a chemical mechanical polishing method).

Figure 24:
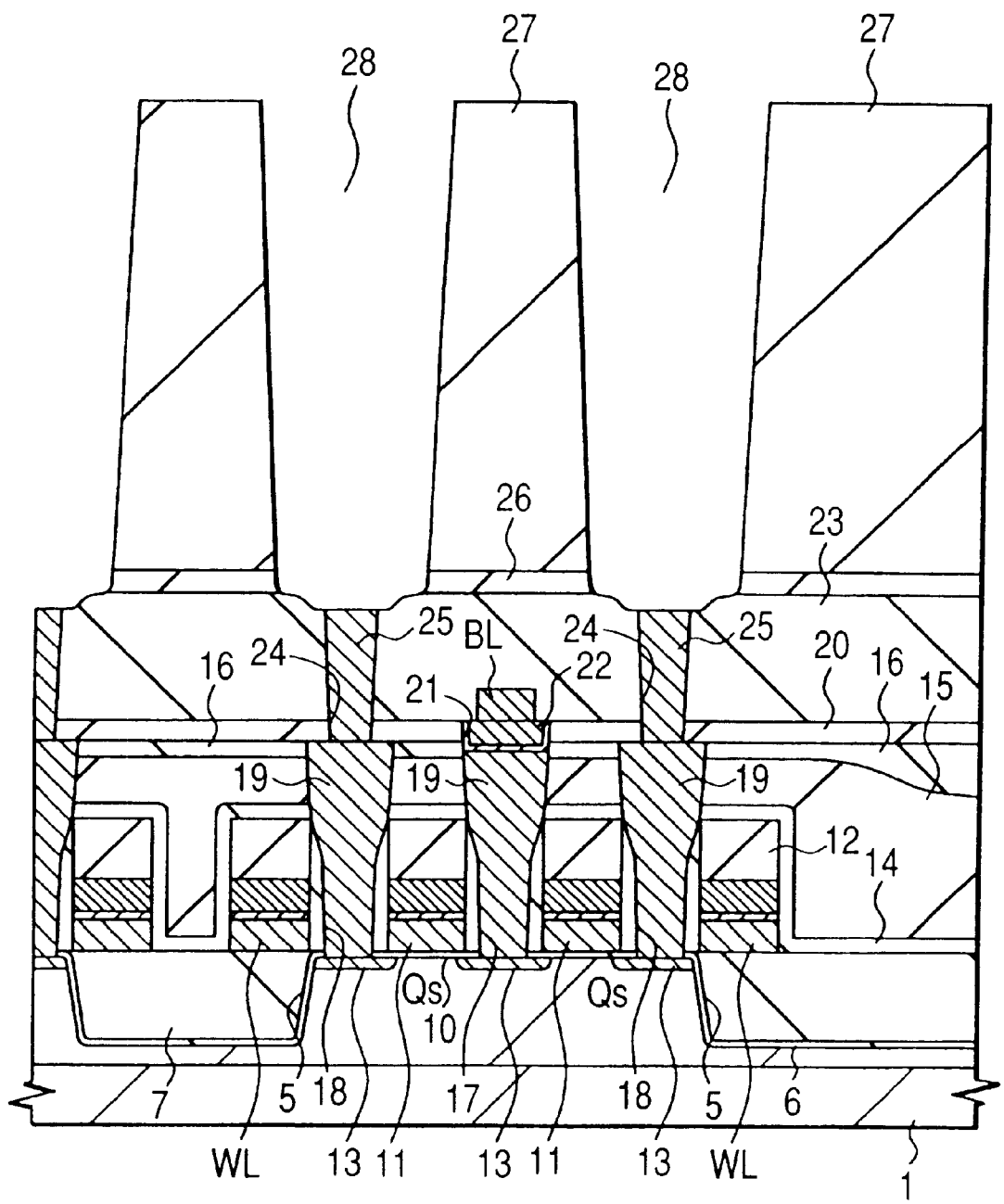
FIG. 24 is a sectional view of an essential part of a silicon substrate showing a step in the method of fabricating a semiconductor integrated circuit device according to one embodiment of the invention.

As shown in FIG. 24, a silicon nitride film 26 is deposited on the silicon oxide film 23 by a CVD method, and a silicon oxide film 27 is further deposited on the silicon nitride film 26 by a CVD method, followed by dry etching the silicon oxide film 27 and the underlying silicon nitride film 26 through a mask of a photoresist film (not shown) thereby forming a groove 28 above the through-hole 25. A lower electrode 29 of a capacitor element C for information storage, to be described hereinafter, is formed along the inner wall of the groove 28, so that in order to increase a quantity of stored charges by increasing the surface area of the lower electrode 29, it becomes necessary to deposit the silicon oxide in a large thickness.

Figure 25:
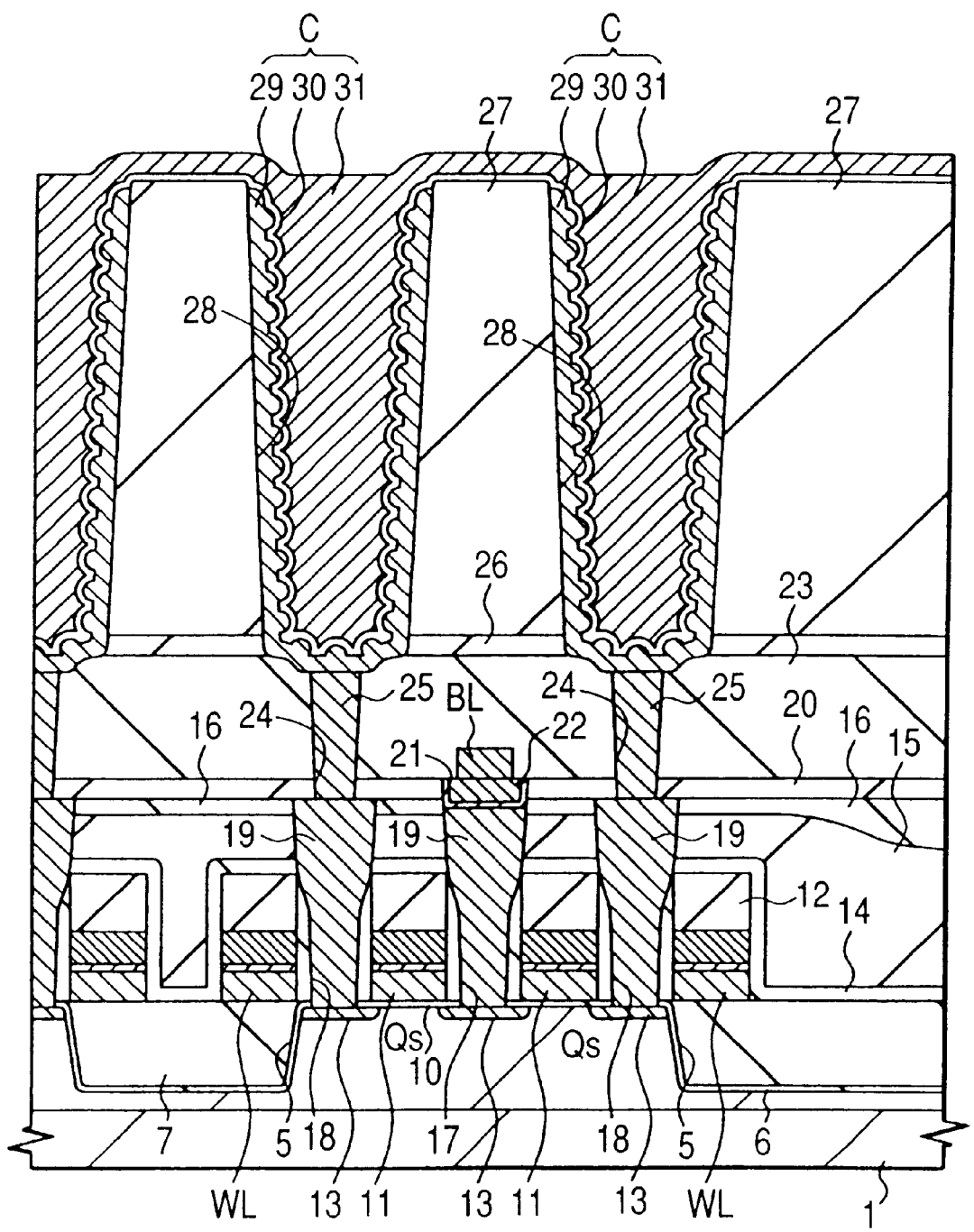
FIG. 25 is a sectional view of an essential part of a silicon substrate showing a step in the method of fabricating a semiconductor integrated circuit device according to one embodiment of the invention.

As shown in FIG. 25, a capacitor element C for information storage, consisting of the lower electrode 29, a capacitive insulating film 30 and an upper electrode 31, is formed inside the groove 28. The lower electrode 29 is formed, for example, of a phosphorus (P) doped, low resistance polysilicon film, and the capacitive insulating film 30 is formed, for example, of a tantalum oxide ($Ta_2O_5$) film. The upper electrode 31 is constituted of a TiN film. According to these steps, as illustrated hereinabove, memory cells, which are individually constituted of the MISFETQs for memory cell selection and capacitor elements C for information storage connected in series therewith, are completed.

The embodiments of the invention made by us have been particularly described and should not be construed as limiting the invention thereto, and many variations and modifications may be possible without departing from the spirit of the invention.

In the foregoing embodiments, although the application of fumed silica to a polishing slurry has been illustrated, a polishing slurry to which colloidal silica is added may be applied to chemical mechanical polishing in the practice of the invention.

In the foregoing embodiments, the chemical mechanical polishing has been applied to the planarization step of an insulating film, and may be applicable to a procedure wherein a conductive film on an insulating film, in which a wiring groove or a through-hole has been formed, may be planarized so as to form a buried wiring or plug.

More particularly, in a case where the invention is applied to planarization for element isolation, such as of SGI, scratches can be reduced in number in an element-forming region leading to the silicon surface of an active region, so that high reliability is effectively obtained particularly in a planarization step of a high density integrated circuit. Alternatively, where the chemical mechanical polishing technique of the invention is used for the planarization of an ordinary interlayer insulating layer, scratches or microscratches extending over adjacent interlayer regions can be reduced in number, so that electric or electrochemical stability in the interlayer regions can be improved. Moreover, the invention contributes to improved reliability of ordinary elements, like the above-stated cases.

The effects attained by a typical embodiment of the invention are summarized below.

According to an embodiment of the invention, since the density of coagulated particles in a polishing slurry used in a chemical mechanical polishing process can be reduced, the occurrence of microscratches can be suppressed, thereby improving the yield and reliability of the semiconductor integrated circuit device manufactured in a process using a chemical mechanical polishing step.

What is claimed is:

1. A method for manufacturing a semiconductor integrated circuit device comprising the steps of:
   (a) allowing a polishing slurry used for chemical mechanical polishing to stand so that a concentration of coagulated particles having a size of 1 $\mu$m or over in said polishing slurry is at 200,000 particles/0.5 cc or below; and
   (b) subjecting a surface to be processed of individual wafers running through a mass-production process to chemical mechanical polishing while supplying said polishing slurry obtained after the step (a) to said surface.

2. A method for manufacturing a semiconductor integrated circuit device according to claim 1, wherein the concentration of the coagulated particles having a size of 1 $\mu$m or below in said polishing slurry is at 50,000 particles/0.5 cc or below.

3. A method for manufacturing a semiconductor integrated circuit device according to claim 1, wherein the concentration of the coagulated particles having a size of 1 $\mu$m or below in said polishing slurry is at 20,000 particles/0.5 cc or below.

4. A method for manufacturing a semiconductor integrated circuit device according to claim 1, wherein said coagulated particles are mainly made of silica.

5. A method for manufacturing a semiconductor integrated circuit device according to claim 4, wherein said silica is mainly made of fumed silica.

6. A method for manufacturing a semiconductor integrated circuit device according to claim 1, wherein the chemical mechanical polishing step is a step of forming a polished, planarized insulating film isolation groove in a main surface of said individual wafers.

7. A method for manufacturing a semiconductor integrated circuit device according to claim 1, wherein the concentration of said coagulated particles having a size of 1 $\mu$m or below is determined by measuring a size of coagulated particles contained in said polishing slurry.

8. A method for manufacturing a semiconductor integrated circuit device according to claim 1, further comprising filtering said polishing slurry after the step (a) and prior to the step (b).

9. A method for fabricating a semiconductor integrated circuit device comprising the steps of:
   (a) forming a groove in an element isolation region over a main surface of a wafer by etching said element isolation region over the main surface of the wafer by use, as a mask, of an oxidation-resistant insulating film formed over the main surface of said water;
   (b) forming a silicon oxide insulating film over the main surface of said wafer including the inside of the groove; and
   (c) subjecting said silicon oxide insulating film to chemical mechanical polishing through said oxidation-resistant insulating film as a stopper for polishing so that said silicon oxide insulating film is selectively left inside the groove thereby forming a polished, planarized insulating film isolation groove in said element isolation region on the main surface of said wafer,
   wherein when said silicon oxide insulating film is subjected to chemical mechanical polishing, a polishing slurry obtained after allowing to stand until a concentration of coagulated particles having a size of 1 $\mu$m or over is at 200,000 particles/0.5 cc of the slurry or below is used.

10. A method for fabricating a semiconductor integrated circuit device according to claim 9, wherein said polishing slurry is allowed to stand until the concentration of the coagulated particles having a size of 1 $\mu$m or over is at 50,000 particles/0.5 cc.

11. A method for fabricating a semiconductor integrated circuit device according to claim 9, wherein said polishing slurry is allowed to stand until the concentration of the coagulated particles having a size of 1 $\mu$m or over is at 20,000 particles/0.5 cc.

12. A method for fabricating a semiconductor integrated circuit device according to claim 9, wherein the concentration of said coagulated particles having a size of 1 μm or below is determined by measuring a size of coagulated particles contained in said polishing slurry.

13. A method for fabricating a semiconductor integrated circuit device according to claim 9, wherein said coagulated particles are mainly made of silica.

14. A method for fabricating a semiconductor integrated circuit device comprising the steps of:
   (a) forming a groove in an element isolation region over a main surface of a wafer by etching said element isolation region over the main surface of said wafer by use, as a mask, of an oxidation-resistant insulating film formed over the main surface of said water;
   (b) forming a silicon oxide insulating film over the main surface of said wafer including the inside of said groove; and
   (c) subjecting said silicon oxide insulating film to chemical mechanical polishing through said oxidation-resistant insulating film as a stopper for polishing so that said silicon oxide insulating film is selectively left inside the groove thereby forming a polished, planarized insulating film isolation groove in said element isolation region over the main surface of said wafer, wherein when the silicon oxide insulating film is subjected to chemical mechanical polishing, a polishing slurry obtained after allowing to stand for 30 days or over is used.

15. A method for fabricating a semiconductor integrated circuit device according to claim 14, wherein said polishing slurry is allowed to stand for 40 days or over.

16. A method for fabricating a semiconductor integrated circuit device according to claim 15, wherein said polishing slurry is allowed to stand for 45 days or over.

17. A method for fabricating a semiconductor integrated circuit device according to claim 14, wherein said coagulated particles are mainly made of silica.

18. A method for manufacturing a semiconductor integrated circuit device comprising the steps of:
   (a) allowing a polishing slurry used for chemical mechanical polishing to stand so that a concentration of coagulated particles having a size of 1 μm or over in said polishing slurry is at 200,000 particles/0.5 cc or below; and
   (b) subjecting a surface to be processed of individual wafers running through a mass-production process to chemical mechanical polishing while supplying said polishing slurry obtained after the step (a) to said surface.

19. A method for fabricating a semiconductor integrated circuit device according to claim 18, wherein the concentration of the coagulated particles having a size of 1 μm or over in said polishing slurry is at 50,000 particles/0.5 cc or below.

20. A method for fabricating a semiconductor integrated circuit device according to claim 19, wherein the concentration of the coagulated particles having a size of 1 μm or over in said polishing slurry is at 20,000 particles/0.5 cc or below.

21. A method for fabricating a semiconductor integrated circuit device according to claim 18, wherein said polishing slurry is allowed to stand for 30 days or over.

22. A method for fabricating a semiconductor integrated circuit device according to claim 21, wherein said polishing slurry is allowed to stand for 40 days or over.

23. A method for fabricating a semiconductor integrated circuit device according to claim 22, wherein said polishing slurry is allowed to stand for 45 days or over.

24. A method for fabricating a semiconductor integrated circuit device according to claim 18, wherein said coagulated particles are mainly made of silica.

* * * * *